United States Patent
Galluppi

(10) Patent No.: US 8,305,282 B2
(45) Date of Patent: Nov. 6, 2012

(54) FIELD PROBE

(75) Inventor: Jason Galluppi, Richlandtown, PA (US)

(73) Assignee: Amplifier Research Corporation, Souderton, PA (US)

( * ) Notice: Subject to any disclaimer, the term of this patent is extended or adjusted under 35 U.S.C. 154(b) by 363 days.

(21) Appl. No.: 12/842,700

(22) Filed: Jul. 23, 2010

(65) Prior Publication Data

US 2012/0019426 A1    Jan. 26, 2012

(51) Int. Cl.
*H01Q 21/00* (2006.01)
(52) U.S. Cl. ......... 343/810; 343/816; 343/820; 343/797
(58) Field of Classification Search .................. 343/797, 343/810, 816, 820; 324/72, 247, 260, 262
See application file for complete search history.

(56) References Cited

U.S. PATENT DOCUMENTS

| | | | |
|---|---|---|---|
| 5,300,885 A * | 4/1994 | Bull | 324/247 |
| 6,593,896 B2 * | 7/2003 | Choder | 343/802 |
| 2007/0075908 A1 * | 4/2007 | Ganeshan et al. | 343/797 |

* cited by examiner

*Primary Examiner* — Hoang V Nguyen
(74) *Attorney, Agent, or Firm* — Howson & Howson LLP

(57) ABSTRACT

In a stalk-type field probe, each of three resistive dipoles is formed with a resistive feedline on a common circuit board. Each circuit board comprises an elongated feedline section that extends through a cylindrical stalk, and a cross-arm that is disposed at a 54.7° angle relative to the elongation of the feedline section. The feedline sections are arranged to form an equilateral triangular prism, and the cross arms are arranged so that the dipole on each cross-arm is perpendicular to an imaginary plane to which the lines along which the elements of both of the other dipoles extend are parallel.

18 Claims, 5 Drawing Sheets

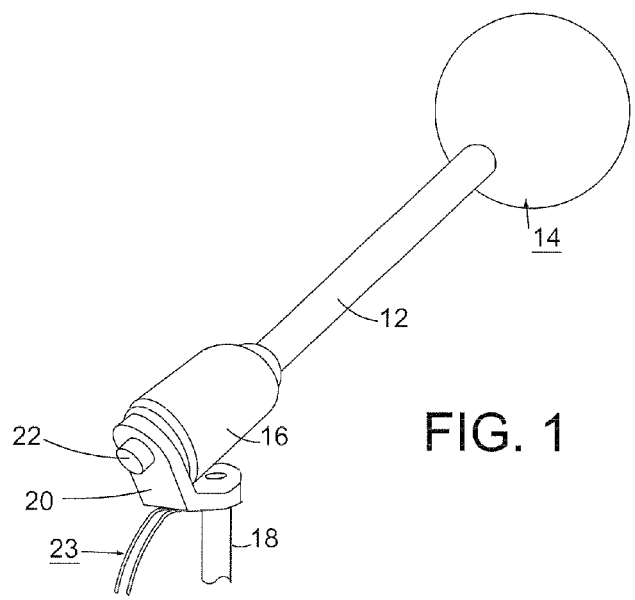
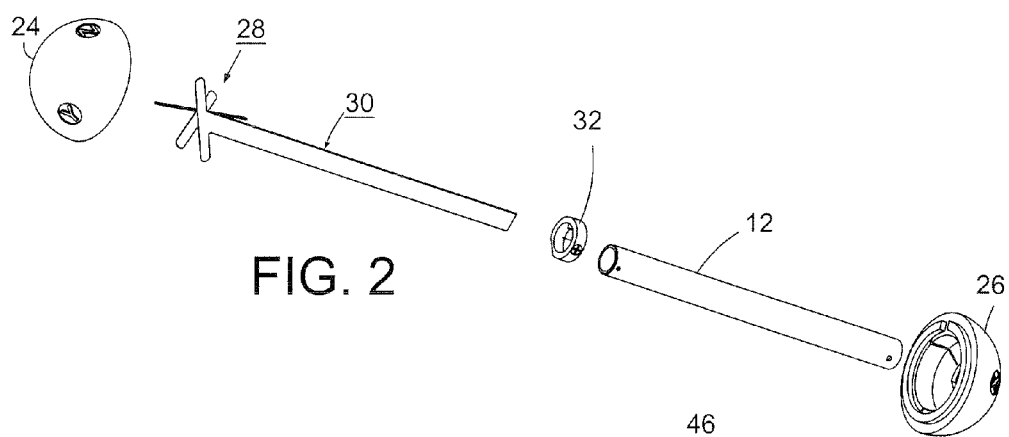
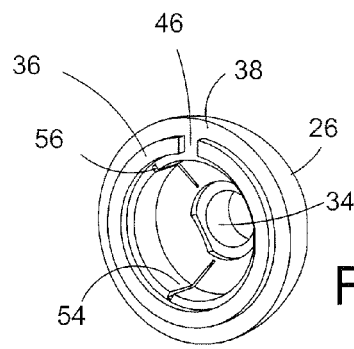
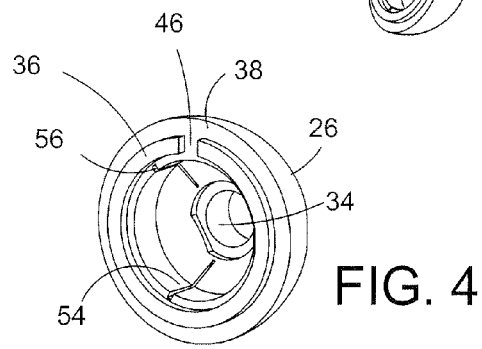

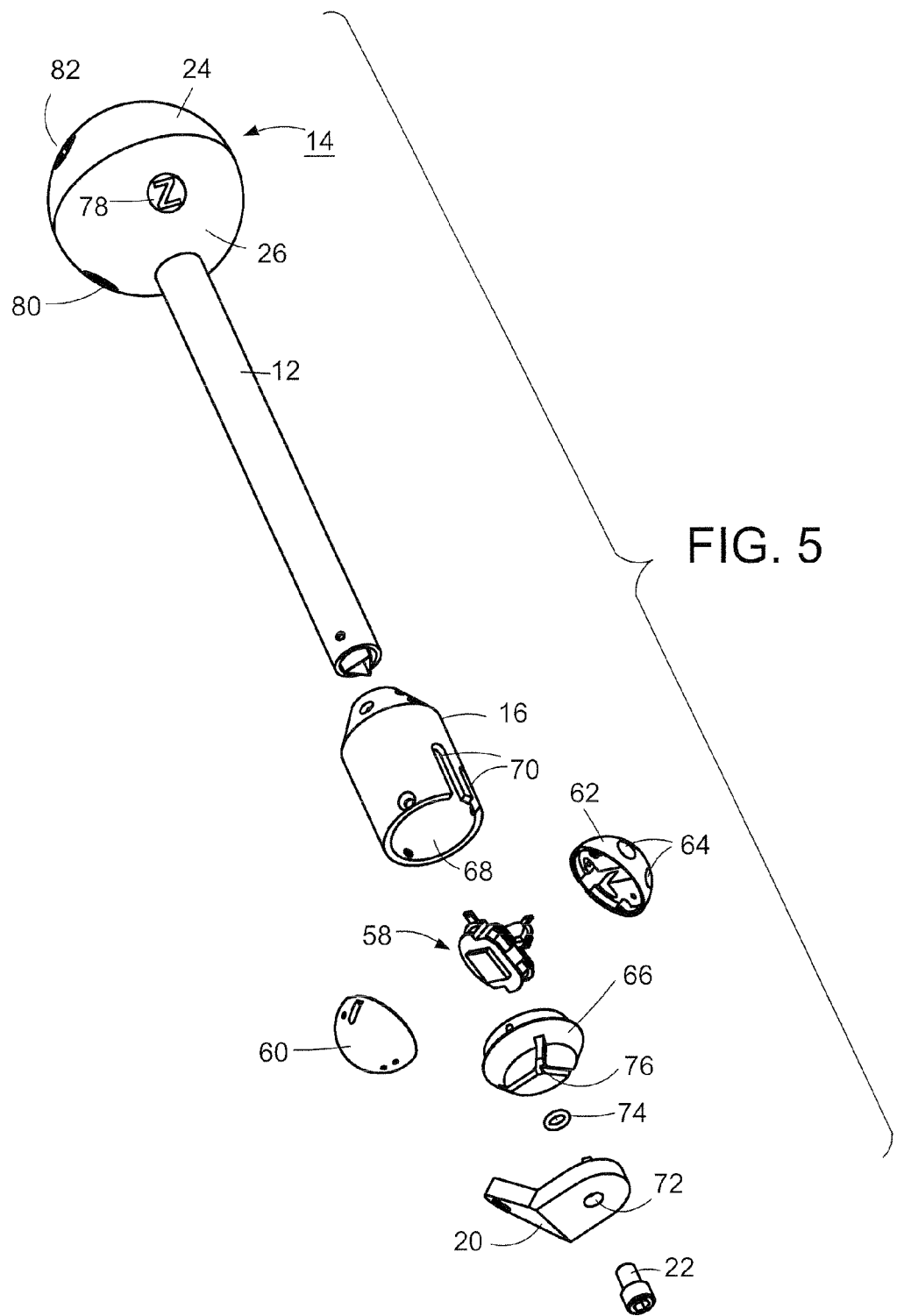

FIELD PROBE

FIELD OF THE INVENTION

This invention relates to field probes for use in measuring electromagnetic fields in high frequency applications, and more particularly to an improved field probe for use in electric field measurements.

BACKGROUND OF THE INVENTION

Field probes are used in evaluating the performance of many different kinds of radio frequency equipment, and are also essential components of radiated immunity testing systems for use in ensuring that electrical and electronic and systems in products such as automobiles are not adversely affected by stray fields such as radio and television transmissions, radar pulses, cellular telephone signals, powerline fields, and the other kinds of electromagnetic fields.

Several different kinds of field probes are used in the above-mentioned applications. These include cube probes, sphere probes, and so-called "stalk probes." A typical cube probe includes three mutually perpendicular sensing elements extending from three faces of a cube-shaped housing containing electronic circuitry. A sphere probe is similar to the cube probe, but the spherical shape of the electronics housing helps to prevent probe orientation from affecting field measurements. In the stalk probes, sensors are disposed in an RF-transparent housing and connected to associated electronic circuitry by a transmission line extending through an elongated tube, thereby keeping the electronic circuitry remote from the sensors in order to minimize interference by the electronic elements with the incident radiation.

A typical probe sensor includes a detecting diode that delivers a DC signal the amplitude of which corresponds to the magnitude to the field incident on the sensor. The electronic circuitry in these probes processes the DC signals, delivering a composite signal representing the "X", "Y" and "Z" axis field components as the square root of the sum of the squares of the individual components. The circuitry can also supply signals representing the X, Y and Z components independently. The circuitry typically also extends the dynamic range of the probe, improves the linearity of the probe's response, controls sampling, and protects against overload.

With each of the three types of probes, it is desirable to avoid the use of conductive wiring to supply electric power and control signals to the electronic circuitry and to deliver data from the electronic circuitry to external monitoring equipment. Accordingly, it has been common to utilize electrochemical cells to supply power to the probes' internal electronic circuitry and to use optical fibers to deliver data to the monitoring equipment. It is also common to utilize laser radiation to supply operating power to a probe's electronic circuitry, supplying laser light through an optical fiber to a converter that generates DC operating power for the electronic circuitry.

Broadband field probes, utilizing short dipole antennas formed by thin film resistive strips with diodes in series with the strips to convert RF to DC signals, have been described by Samuel Hopfer in U.S. Pat. No. 4,207,518, granted Jun. 10, 1980 and U.S. Pat. No. 4,392,108, granted Jul. 5, 1983. These patents have formed the basis for a number of practical electric field probes having a high bandwidth, and the entire disclosures of both patents are herein incorporated by reference.

Problems encountered with conventional broadband field probes of the kind mentioned above include difficulties in measuring DC voltage across a detector diode situated at the mid-point of a short dipole, avoidance of metal objects near the sensors, and avoidance of conductors for coupling the sensors to the electronic circuitry. A resistive connection between the sensors and the electronic circuitry has generally been considered to be the best solution to the problems posed by metal objects and conventional conductors, and carbon feed lines have been typically used.

The connections between the feed lines and the sensing elements give rise to manufacturing difficulties. It is difficult to make mechanically reliable connections that do not impair the probe's frequency response.

SUMMARY OF THE INVENTION

This invention falls into the category of stalk probes, and comprises three mutually orthogonal dipole antennas, connected to a feedline extending lengthwise through a tubular stalk connecting an RF-transparent sensor housing to a remote housing containing electronic circuitry. The probe differs from conventional three-element probes principally in that each of the dipoles and its feedline are formed on a unitary circuit board, and the circuit boards are configured in such a way that the three dipoles are in close proximity, but do not interfere mechanically with one another.

A radio frequency field probe according to the invention comprises a hollow stalk, elongated along a stalk axis, and having first and second opposite ends. A hollow, RF-transparent, housing is connected to, and located adjacent, the first end of the stalk. An electronic housing is connected to, and located adjacent, the second end of the stalk. Thus, the electronic housing is remote from the RF-transparent housing.

A set of three dipoles is disposed within the RF-transparent housing, each dipole has two elements extending in opposite directions along a line from a central feed point. The feed points of the three dipoles are located, in close proximity to one another, respectively at the centers of the bases of an equilateral triangle to which the stalk axis is perpendicular. The three elongated feedlines are connected respectively to the feed points of the dipoles and extend along a direction of elongation through the hollow stalk in parallel relationship to the stalk axis. The line along which the elements of each dipole extend from the dipole's feedpoint is disposed at an angle of 54.7 degrees relative to the direction of elongation of the dipole's feedline. The line along which the elements of each dipole extend is orthogonal to an imaginary plane to which the lines along which the elements of both other dipoles extend are parallel. The elements of each dipole and the feedline connected to the feedpoint thereof are formed as thin film resistive elements on a common circuit board.

A preferred embodiment of the field probe the circuit includes three circuit boards. Each dipole, and the feedline connected to the feedpoint thereof, are formed as thin film resistive elements on one of the three circuit boards. Each circuit board comprises a first elongated part on which a feedline is formed. This first elongated part has elongated side edges extending parallel to the direction of elongation of the first elongated part, and first and second opposite ends separated from each other along the direction of elongation. The first elongated part also has a cross-member at its first end, on which a dipole is formed. The cross-member is in the form of a narrow elongated strip disposed at an angle of 54.7 degrees relative to the direction of elongation of the first elongated part.

The side edges of the first elongated part of each of the three circuit boards can be disposed in edge-to-edge relationship with side edges of the other two circuit boards respectively so that the first elongated parts of the three circuit boards take the form of side walls of an elongated, equilateral, triangular prism, i.e., a prism having equilateral, triangular cross-sections transverse to its direction of elongation.

Adhesive tape located within the elongated equilateral triangular prism can be used to secure the first elongated part of one of the three circuit boards in edge-to-edge-relationship with the first elongated parts of the other two circuit boards. Additional adhesive tape located outside the elongated equilateral triangular prism can be used to secure those other two circuit boards in edge-to-edge relationship.

In a preferred embodiment, each of the cross-members of each circuit board has a first part extending at an acute angle from the first elongated part thereof and a second part extending at an obtuse angle from the first elongated part thereof. The first part of the cross member of each circuit board extends between the first elongated part, and the second part of the cross member, of an adjacent one of the circuit boards.

In a preferred embodiment, the RF-transparent housing is a hollow sphere having an inner wall including six slots, each slot receiving and closely fitting an end of one of the cross-members of the circuit boards.

Each of the circuit boards has first and second opposite faces, and the thin film resistive elements are disposed on a first face of each circuit board with conductive pads for making electrical connections to the thin film resistive elements. In a preferred embodiment, each circuit board includes a first masking layer covering substantially the entire first face thereof, except at the locations of the conductive pads, for preventing solder from adhering to parts of the circuit boards other than said conductive pads. Substantially the entire second face of each circuit board is also covered by a second masking layer having a surface tension substantially the same as that of the first masking layer.

A detecting diode may be provided on each dipole, connecting the two elements thereof at the feed point, and a shunt circuit including resistive and capacitive elements is preferably connected across each such diode.

The thin film resistive elements are preferably composed of a nickel-chromium alloy. Conductive pads for making electrical connections to the thin film resistive elements, are preferably formed as a copper layer overlying portions of the thin film resistive elements. Each of two conductive pads at the feed paint of each dipole is connected to one of the two dipole elements, and is formed as a copper layer overlying a portion of a dipole element. A shunt circuit includes a diode having an anode and a cathode connected respectively to the conductive pads.

Conductive pads can also be provided at ends of the elements of each dipole remote from the feed point thereof, for making electrical test connections to the dipole elements. These conductive pads are also formed as a copper layer overlying portions of the thin film resistive elements.

The probe can also include conductive pads at a location on each feedline remote from the feedpoint of the dipole connected thereto, for connection of the feedline to electronic circuitry within the electronic housing.

Preferably, the feedline comprises two parallel traces of resistive thin film. These traces are substantially straight throughout length of the feedline except for a portion thereof immediately adjacent the feedpoint of the dipole connected thereto. The traces of the portion immediately adjacent the feedpoint can be curved so that they meet the feedpoint in a direction perpendicular to the directions of the dipole elements.

By virtue of the incorporation of each dipole and its feedline on a common circuit board, the probe can be manufactured less expensively, and can exhibit improved performance particularly by way of a comparatively flat frequency response, a broad frequency range, and low isotropic deviation. In addition, the fact that the circuit board arms are received in slots formed inside the RF-transparent housing makes it possible to indicate the positions and orientation of the dipoles by providing markings on the exterior of the RF-transparent housing.

Further objects and advantages of the invention will be apparent from the following description when read in conjunction with the drawings.

BRIEF DESCRIPTION OF THE DRAWINGS

FIG. 1 is a perspective view of an embodiment of the field probe according to the invention;

FIG. 2 is an exploded perspective view of a the stem, antenna and a spherical antenna enclosure of the probe;

FIG. 3 is a perspective view of a first part of the spherical antenna enclosure;

FIG. 4 is a perspective view of a second part of the spherical antenna enclosure;

FIG. 5 is an exploded perspective view, showing the antenna enclosure, the stem, and components of a mounting device and electronic circuitry enclosure at the end of the step opposite from the antenna enclosure;

DETAILED DESCRIPTION OF THE PREFERRED EMBODIMENTS

Figures 6, 7:
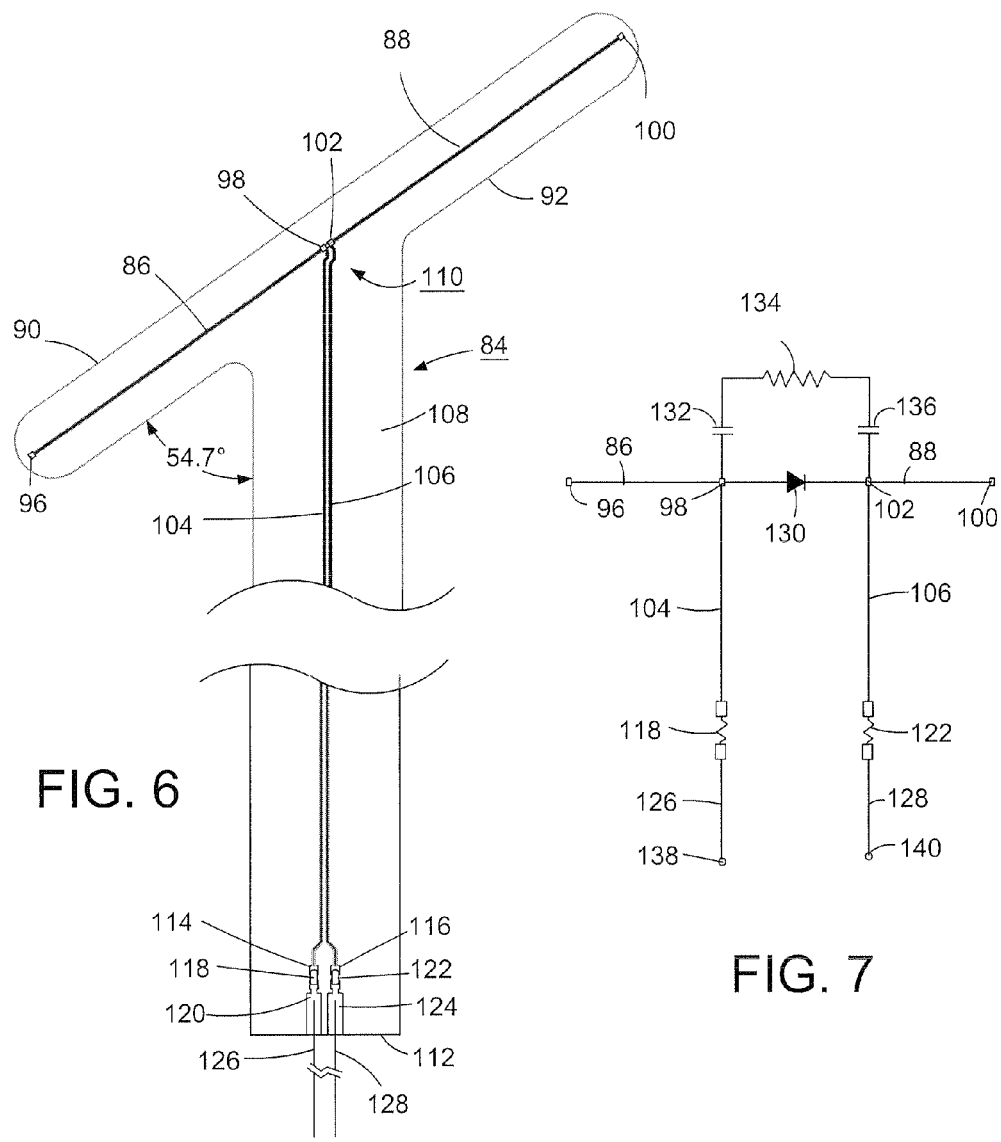
FIG. 6 is an elevational view showing one of three substantially identical components of the three-component dipole and feedline circuit boards.
FIG. 7 is a schematic diagram showing the feedline, dipole elements, discrete electronic components and feedline of one of the dipole and feedline circuit boards.

The field probe as shown in FIG. 1 comprises a tubular stalk 12 having a spherical, radio frequency-transparent housing 14 at one end and an electronic circuit housing 16 at the opposite end. The electronic circuit housing 16 is supported on a vertical post 18 by a bracket 20, which is configured so that the axis of the stalk is disposed at an angle relative to a horizontal plane corresponding to the angle between the diagonal of a cube and its base, i.e., approximately 35.3°. The electronic circuit housing 16 is secured to the bracket 20 by a screw 22, which can be loosened to allow rotation of the probe about the axis of the stalk. As will appear from the description to follow, the dipoles are disposed at 54.7° (90°-35.3°) relative to the stalk axis. Consequently any one of the dipoles can be brought to a vertical position by rotation of the probe about the stalk axis, and the three dipoles inside the RF-transparent housing 14 can be oriented in relation to mutually perpendicular X, Y and Z axes.

Cables 23 are fiber optic cables which supply operating power and control signals to electronic circuitry within housing 16 and deliver output signals from the electronic circuitry to external monitoring equipment. Operating power can be supplied through one of the cables by means of an infrared laser. The use of optical fibers minimizes interference with field measurements which would occur if electrical conductors such as wires, or coaxial transmission lines were used, and avoids the use of self-contained electrochemical power sources, which need to be replaced from time to time.

In FIG. 2 the stalk, the RF-transparent housing, and an assembly of circuit boards on which the dipoles and their feedlines are formed, are shown in exploded view. The housing comprises two hemispherical parts 24 and 26, which in the final assembly enclose an array 28 consisting of three dipoles respectively on arms formed at the ends of three circuit boards having elongated parts on which the feedlines of the dipoles are formed. The elongated parts form an equilateral triangular prism 30 that extends through the hollow stalk 12. The stalk 12, in turn, extends through a collar 32 that fits into a recess 34 in hemispherical housing part 26, the recess being shown in FIG. 4. The collar is secured to the stalk, and has at least one flat part fitting a correspondingly shaped flat part of the recess in order to prevent rotation of the housing 14 relative to the stalk.

The hemispherical housing parts can be composed of any of various RF-transparent materials, but are preferably molded from foamed polystyrene having high strength and very small pores.

As shown in FIGS. 3 and 4, the RF-transparent housing parts 24 and 26 have complementary interfitting parts. A circular ridge 36 formed on a face 38 of hemisphere 26 has a gap 46. When face 38 of hemisphere 26 meets face 40 of hemisphere 24 The ridge 36 fits into a recess 42, and a protrusion 44 extending inwardly from face 40 of hemisphere 24 fits into gap 46 on hemisphere 26 to establish a particular relationship between slots 48, 50 and 52 (FIG. 3), formed on the interior of hemisphere 24 and similar slots 54, 56 (FIG. 4), and another similar slot (not seen in FIG. 4). The slots on each hemisphere are circumferentially spaced from one another by 120° about the longitudinal axis of the stalk 12, and each slot on hemisphere 26 is circumferentially spaced by approximately 180° from a slot in hemisphere 24. Consequently, a pair of slots, respectively on the two hemispheres 24 and 26 receive the ends of each of the arms of array 28 to secure the arms in fixed relationship to one another and to the RF-transparent spherical housing 14. Slots 52 (FIG. 3) and 54 (FIG. 4) receive opposite, ends of one of the arms. Slots 48 (FIG. 3) and 56 (FIG. 4) similarly receive opposite ends of another arm of array 28. Slot 50 (FIG. 3) and another slot (not seen in FIG. 4) receive opposite ends of a third arm. The angular relationship of the slots and their orientation relative to the axis of the stalk are adjusted slightly to take into account the fact that the arms of array 18 are displaced radially by a short distance from the axis of the stalk.

As shown in FIG. 5, the end of stalk 12 remote the RF-transparent spherical housing 14 is connected to electronic circuit housing 16. Within the housing 16 is a circuit module 58, which is encased in a protective spherical enclosure composed of two hemispherical parts 60 and 62. Part 62 has openings 64 for fiber optic cable connections for carrying infrared power to a converter included in the circuit module 58 and for carrying optical signals to and from the circuit assembly. One of the functions of hemispherical parts 60 and 62 is to shield the electronic circuit module from the electric field being measured.

An end closure 66 fits the open end 68 of the electronic circuit housing 16, leaving parts of slots 70 in the cylindrical housing side wall open for passage of the fiber optic cables. Locking screw 22 extends through hole 72 in bracket 20, and through washer 74 into a threaded hole 76 in end closure 66.

As shown in FIG. 5, letters marked on, or preferably molded on, the exterior of the spherical housing 14 indicate the positions of the three dipoles inside it. Identical letters are positioned adjacent the opposite ends of each dipole. Thus, letter 78 (a "Z") and letter 80 (a "Y") are formed on hemisphere 26, and a letter 82 (an "X") is formed on hemisphere 24. A counterpart, not visible in FIG. 5, is formed diametrically opposite each letter. By loosening the screw 22 and rotating the assembly consisting of the electronics housing, the stalk and the RF-transparent housing, the device can be oriented so that any of the three "X", "Y" and "Z" axes is horizontal or so that any of three axes is vertical.

The three circuit boards of the assembly shown in FIG. 2 are identical, and one such circuit board 84 is shown in FIG. 6. The circuit board is preferably a laminate having a glass-reinforced hydrocarbon and ceramic dielectric layer, and an etched nickel-chromium (NiCr) layer forming restive paths, also referred to as resistive traces, on a surface of the dielectric layer.

As initially supplied, the circuit board, available from Rogers Corporation of Chandler, Ariz., USA, comprises the dielectric layer, the resistive NiCr layer, and an overlying copper film. The copper film and resistive NiCr layer can be selectively etched to form resistive elements and to form copper pads for making electrical connections to the resistive elements. As a first step in the etching process, a photoresist is applied to the copper foil layer. The pattern of the resistive traces and conductive copper pads is defined photographically. Following exposure and development of the photoresist layer, the copper and NiCr layers are simultaneously removed by etching, using a suitable etchant such as a mixture of copper chloride and hydrochloric acid. The remaining photoresist layer is then stripped away, leaving a pattern composed of a NiCr layer and an overlying copper layer. A second photoresist layer is then applied, and the pattern of the resistive traces is defined photographically. The second photoresist layer is exposed and developed, leaving photoresist over the areas where copper foil is to remain on the circuit board. The remaining copper is then selectively removed without removing the NiCr resistive layer by applying an ammoniacal etching solution, typically comprising a mixture of ammonium chloride, orthophosphoric acid, ammonium hydroxide and cupric chloride. The remaining photoresist is then stripped away, leaving on the circuit board the desired NiCr resistive traces and copper foil connecting pads.

In the case of the circuit board 84 in FIG. 6, NiCr resistive traces 86 and 88, respectively formed on arms 90 and 92 of the circuit board, constitute the elements of a dipole. These resistive traces 86 and 88 are preferably aligned with each other and extend in opposite directions from a central feed point. Each resistive trace has a constant resistance along its length, with a preferred resistivity of 25 ohms per square.

A copper pad 96 is formed at the outer end of resistive trace 86 and a similar copper pad 98 is formed at the inner end of trace 86. Similar copper pads 100 and 102 are formed respectively at the outer and inner ends of resistive trace 88. A feedline for the dipole is formed by two parallel resistive traces 104 and 106, which extend lengthwise along an elongated strip 108, which extends from the cross member formed by arms 86 and 88 at an angle of 54.7°.

Adjacent the feedpoint 110, the resistive traces 104 and 106 are curved so that they meet the copper pads at the feed point in a direction perpendicular to the direction along which the dipole elements extend.

Figure 8:
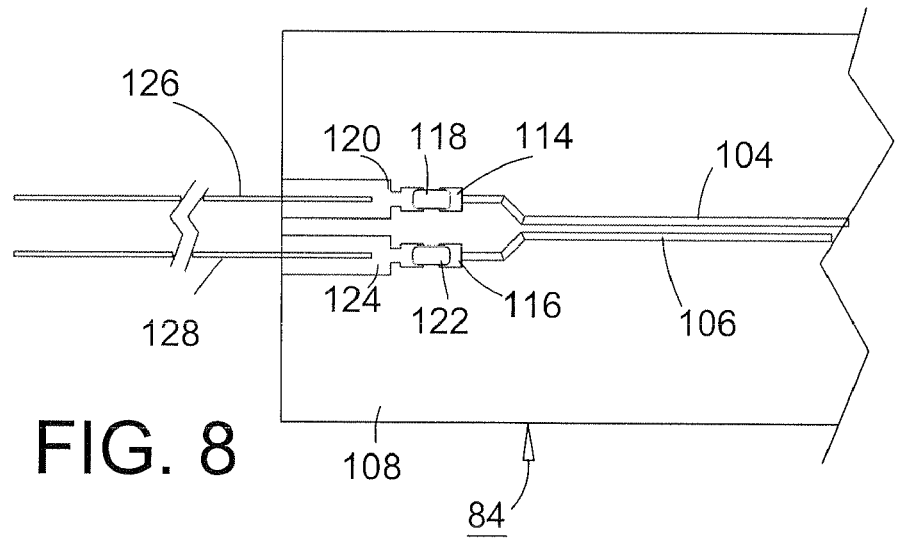
FIG. 8 is an enlarged plan view showing details of the end of the circuit board of FIG. 6 opposite from the end at which the dipole thereof is located.

As shown in FIG. 6, and in greater detail in FIG. 8, adjacent the end 112 of circuit board strip 108 remote from the feedpoint, the resistive traces 104 and 106 diverge and are connected to copper pads 114 and 116 respectively. A resistor 118 is connected from copper pad 114 to another copper pad 120 at end 112 of strip 108. A similar resistor 122 is connected from pad 116 to pad 124. Wires 126 and 128, soldered to pads 120 and 124, are used to connect the feedline to the circuitry in module 58 (FIG. 5).

As shown schematically in FIG. 6, at the feed point 110 at which the resistive traces 104 and 106 forming the feedline are connected to the dipole elements 86 and 88, the copper pads 98 and 102 are connected by a diode 130, which is shunted by a series circuit consisting of capacitor 132, resistor 134 and capacitor 136. The shunt circuit flattens the frequency response of the circuit, preventing the DC voltage delivered to the circuit module at terminals 138 and 140 from peaking at a frequency corresponding to a wavelength equal to twice the length of the dipole, and causing the DC voltage to remain comparatively constant over a wide frequency range. In the case of a dipole having an overall length of 5 cm (from pad 96 to pad 100), with dipole element resistances of 3KΩ each, feedline resistances of 30KΩ each, resistors 118 and 132 at 1MΩ each, resistor 134 at 100Ω, and capacitors 132 and 134 at 15 pF each, the shunt circuit can achieve a relatively flat frequency response that varies no more than 3 dB over a range from about 8 MHZ to 6 GHz.

Figure 9:
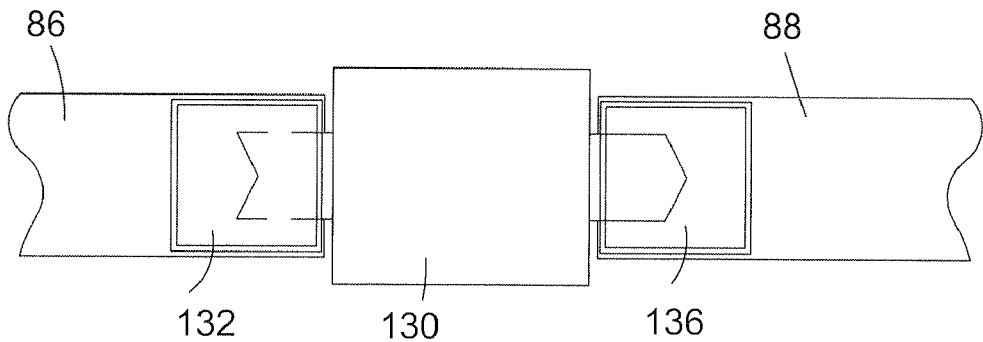
FIG. 9 is an enlarged plan view showing details of a diode at the location at which the feedline on the circuit board meets the dipole elements thereof.
Figure 10:
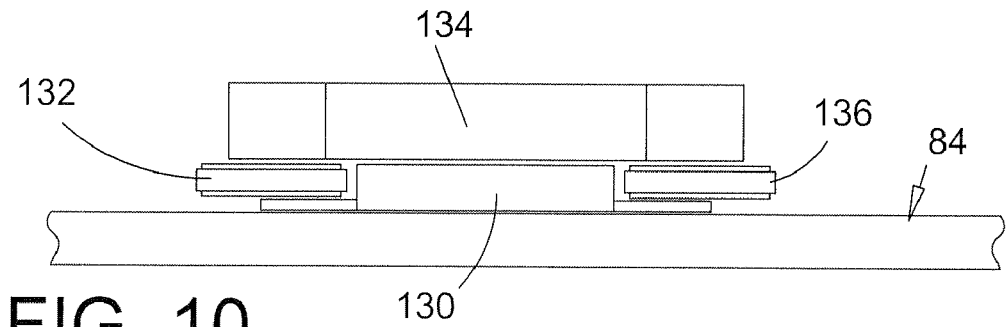
FIG. 10 is an enlarged side elevational view showing details of the diode of FIG. 9, and a shunt circuit composed of two capacitors and a resistor at the location at which the feedline on the circuit board meets the dipole elements thereof.

FIGS. 9 and 10 show details of configuration of the shunt circuit at the feed point. Conductive epoxy resin is preferably used to make the electrical connections at the feed point. FIG. 9 does not show resistor 134, but shows diode 130 and capacitors 132 and 136, with the leads of the diode epoxied to pads at the inner ends of the resistive traces 86 and 88. The capacitors 132 and 136 overlie, and are epoxied to, the diode leads. As shown in FIG. 10, resistor 134 overlies the diode and is epoxied to the capacitors.

Figure 11:
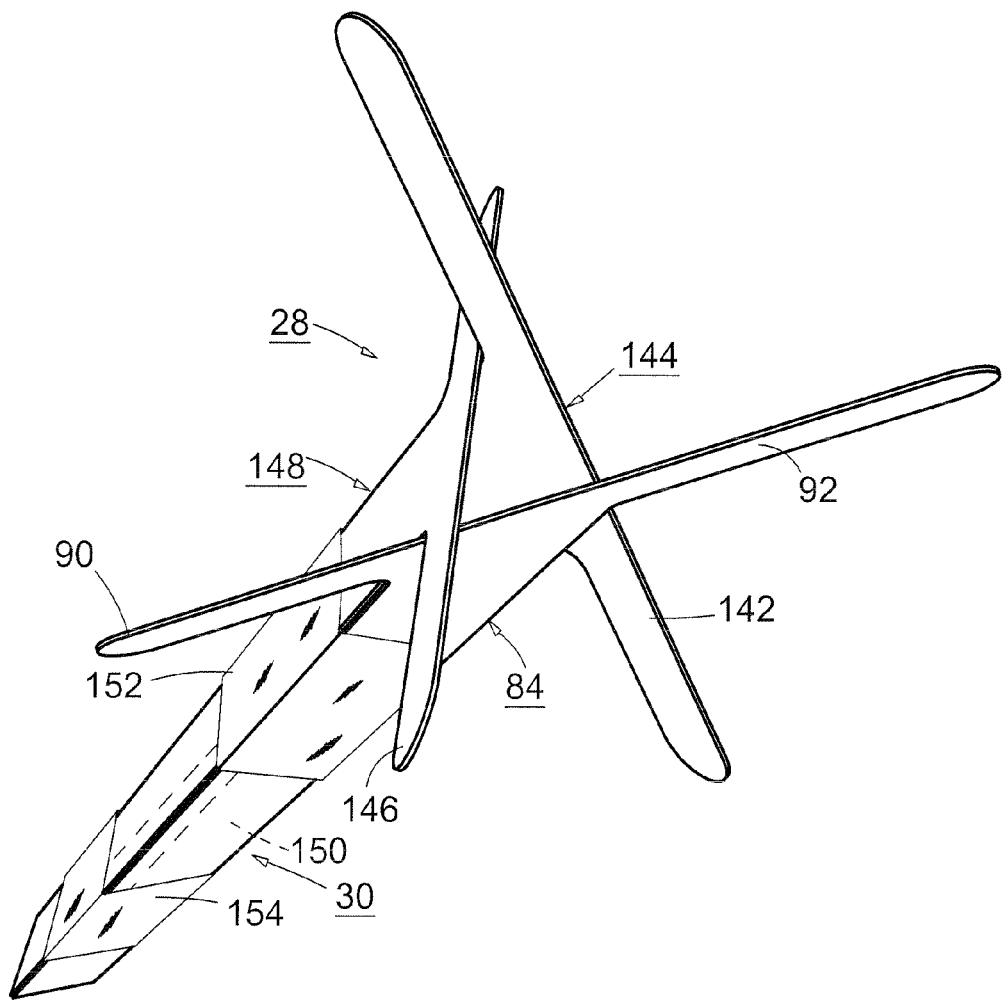
FIG. 11 is a perspective view showing the configuration of three circuit boards constituting the three dipole probe and the feedlines thereof.

The circuit board assembly, the configuration of which is shown schematically in FIG. 11, is composed of three identical circuit boards of the kind illustrated in FIG. 6. The elongated parts on which the feed lines are formed are arranged to form an equilateral triangular prism 30. The cross-arms which form the array 28 are arranged so that each cross-arm extends over a cross-arm of an adjacent board and underneath a cross arm of the other adjacent board. Thus, upwardly extending branch 92 of the cross-arm of circuit board 84 extends over the downwardly extending branch 142 of the cross-arm of circuit board 144, whereas the downwardly extending branch 90 of board 84 extends underneath the upwardly extending branch 146 of circuit board 148.

Because shunting devices at the feedpoints of the dipoles cannot physically interfere with one another, the dipoles on the three arms cannot intersect. Therefore, the feedpoints are located at midpoints of the bases of the equilateral triangle defined by the long parts of the circuit boards on which the feedlines are formed. However, because each of the dipoles is formed on a common circuit board with its feedline, the feedpoints can be positioned sufficiently close to one another that they do not cause serious problems in the measurement of non-uniform fields.

Because the cross-arms are disposed at 54.7 degree angles relative to the long portions of the circuit boards on which the feedlines are formed, and are disposed in planes that intersect one another at an angle of 60°, the line along which the elements of each dipole extend is orthogonal to an imaginary plane to which the lines along which the elements of both other dipoles extend are parallel.

The three circuit boards are preferably secured together so that their longer parts form a triangular prism by means of adhesive-coated tapes. An internal tape 150, located inside the triangular prism, secures side edges of the long part of board 144 respectively to adjacent side edges of boards 84 and 148, but does not cover the meeting edges of boards 84 and 148, allowing the circuit boards to be assembled into the configuration shown in FIG. 11 by folding. After folding, external tapes 152 and 154 are applied to complete the assembly.

The resistive traces are preferably formed on the outside faces of the circuit boards in the assembly shown in FIG. 11. Except at the locations of the copper pads, the outside faces of the circuit boards are covered with a solder mask layer, to prevent solder from adhering to the boards and to the resistive material. A similar, and preferably identical, material is provided on the opposite faces of the circuit boards, balancing the surface tension on the opposite sides of the circuit boards in order to prevent warping of the boards resulting from temperature variations and moisture.

The electronic module in the field probe according to the invention preferably provides independent outputs for each of the dipoles, i.e., X, Y and Z outputs, as well as a composite RSS output (square root of the sum of the squares of the X, Y and Z outputs). The probe can respond to frequencies from below 2 MHZ to above 60 GHz. The electronic module also preferably incorporates plural amplifiers associate with each dipole for extending the dynamic range of the probe so that it can respond to E fields from 2 V/m to 1000 V/m.

In the example described, the resistive traces forming the dipole elements have a constant resistance. As an alternative, the resistive traces can have a tapered resistance by which the resistance progressively increases from the feedpoint toward the ends of the dipole elements. By using tapered resistances, it is possible to flatten the frequency response of the probe without the shunt circuit across the diode at the feedpoint. The tapering of the resistance can be accomplished by forming the dipole elements so that they become progressively narrower, proceeding from the feedpoint toward their outer ends. Adjustments to the frequency response can also be made by the use of tapered resistance dipole elements in combination with a shunt circuit such as the shunt circuit consisting of resistor 134 and capacitors 132 and 136 as shown in FIG. 7.

Many other modifications to the materials, dimensions, configuration, and other aspects of the probe according to the invention can be made without departing from the scope of the invention as defined in the following claims.

What is claimed is:

1. A radio frequency field probe comprising:
   a hollow stalk having first and second opposite ends, the stalk being elongated along a stalk axis;
   a hollow, RF-transparent housing connected to, and located adjacent, the first end of the stalk;
   an electronic housing connected to, and located adjacent, the second end of the stalk whereby the electronic housing is remote from the RF-transparent housing;
   a set of three dipoles disposed within the RF-transparent housing, each dipole having two elements extending in opposite directions along a line from a central feed point, the feed points of the three dipoles being located respectively at the centers of the bases of an equilateral triangle to which the stalk axis is perpendicular; and
   three elongated feedlines connected respectively to the feed points of the dipoles and extending along a direction of elongation through the hollow stalk in parallel relationship to the stalk axis;

wherein:

the line along which the elements of each dipole extend from the dipole's feedpoint is disposed at an angle of 54.7 degrees relative to the direction of elongation of the dipole's feedline;

the line along which the elements of each dipole extend is orthogonal to an imaginary plane to which the lines along which the elements of both other dipoles extend are parallel;

the elements of each dipole and the feedline connected to the feedpoint thereof are formed as thin film resistive elements on a common circuit board.

2. A radio frequency field probe according to claim 1, including three circuit boards, in which each said dipole and the feedline connected to the feedpoint thereof being formed as thin film resistive elements on one of said three circuit boards, in which each said circuit board comprises a first elongated part on which a feedline is formed, said first elongated part having elongated side edges extending parallel to the direction of elongation of the first elongated part, and first and second opposite ends separated from each other along said direction of elongation, and a cross-member on which a dipole is formed located at said first end, the cross-member being in the form of a narrow elongated strip disposed at an angle of 54.7 degrees relative to the direction of elongation of the first elongated part.

3. A radio frequency field probe according to claim 2, in which the side edges of the first elongated part of each of the three circuit boards are disposed in edge-to-edge relationship with side edges of the other two circuit boards respectively, whereby the first elongated parts of the three circuit boards take the form of side walls of an elongated, equilateral triangular prism.

4. A radio frequency field probe according to claim 3, including adhesive tape located within said elongated equilateral triangular prism and securing the first elongated part of one of the three circuit boards in said edge-to-edge-relationship with the first elongated parts of the other two circuit boards.

5. A radio frequency field probe according to claim 4, including additional adhesive tape located outside said elongated equilateral triangular prism and securing said other two circuit boards in edge-to-edge relationship.

6. A radio frequency field probe according to claim 3, in which each of said cross-members of each circuit board has a first part extending at an acute angle from the first elongated part thereof and a second part extending at an obtuse angle from the first elongated part thereof, and in which the first part of the cross member of each circuit board extends between the first elongated part, and the second part of the cross member, of an adjacent one of said circuit boards.

7. A radio frequency field probe according to claim 6, in which said RF-transparent housing is a hollow sphere having an inner wall, and in which said inner wall includes six slots, each said slot receiving and closely fitting an end of one of said cross-members.

8. A radio frequency field probe according to claim 2, in which each of said circuit boards has first and second opposite faces, in which the thin film resistive elements are disposed on a first face of each circuit board, in which each circuit board includes conductive pads on said first face thereof for making electrical connections to the thin film resistive elements thereon, and a first masking layer covering substantially said entire first face thereof, except at the locations of said conductive pads, for preventing solder from adhering to parts of the circuit boards other than said conductive pads, and in which substantially the entire second face of each circuit board is also covered by a second masking layer having a surface tension substantially the same as that of the first masking layer.

9. A radio frequency field probe according to claim 1, including a detecting diode on each dipole, connecting the two elements thereof at the feed point.

10. A radio frequency field probe according to claim 9, including a shunt circuit including resistive and capacitive elements connected across each said diode.

11. A radio frequency field probe according to claim 1, in which the thin film resistive elements are composed of a nickel-chromium alloy.

12. A radio frequency field probe according to claim 11, including conductive pads for making electrical connections to said thin film resistive elements, said conductive pads being formed as a copper layer overlying portions of said thin film resistive elements.

13. A radio frequency field probe according to claim 11, including two conductive pads at the feed point of each said dipole, each of said two conductive pads being connected to one of said two dipole elements and being formed as a copper layer overlying a portion of a dipole element, and a shunt circuit including a diode having an anode and cathode connected respectively to said conductive pads.

14. A radio frequency field probe according to claim 11, including conductive pads at ends of the elements of each dipole remote from the feed point thereof, for making electrical test connections to said dipole elements, said conductive pads being formed as a copper layer overlying portions of said thin film resistive elements.

15. A radio frequency field probe according to claim 11, including conductive pads at a location on each feedline remote from the feedpoint of the dipole connected thereto, for connection of the feedline to electronic circuitry within said electronic housing.

16. A radio frequency field probe according to claim 1, wherein the feedline comprises two parallel traces of resistive thin film, said traces being substantially straight throughout length of the feedline except for a portion thereof immediately adjacent the feedpoint of the dipole connected thereto, and the traces of said portion immediately adjacent the feedpoint being curved and meeting the feedpoint in a direction perpendicular to the directions of the dipole elements.

17. A radio frequency field probe according to claim 1, wherein the resistance of each dipole element of at least one of the dipoles progressively increases proceeding along the dipole element away from the feedpoint thereof.

18. A radio frequency field probe according to claim 1, wherein the resistance of each dipole element progressively increases proceeding along the dipole element away from the feedpoint thereof.

* * * * *